(12) United States Patent
Kim et al.

(10) Patent No.: US 6,453,096 B1
(45) Date of Patent: Sep. 17, 2002

(54) JIG FOR THE BATCH PRODUCTION OF OPTICAL COMMUNICATION APPARATUSES, AND METHOD USING THE SAME

(75) Inventors: Do Youl Kim; Han Jun Koh; Min Ho Choi, all of Seoul (KR)

(73) Assignee: Aligned Technologies Incorporated, Kyonggi-Do (KR)

( * ) Notice: Subject to any disclaimer, the term of this patent is extended or adjusted under 35 U.S.C. 154(b) by 0 days.

(21) Appl. No.: 09/555,452

(22) PCT Filed: Aug. 25, 1999

(86) PCT No.: PCT/KR99/00480

§ 371 (c)(1),
(2), (4) Date: Jul. 31, 2000

(87) PCT Pub. No.: WO01/11404

PCT Pub. Date: Feb. 15, 2001

(30) Foreign Application Priority Data

Aug. 5, 1999 (KR) .............................. 99-32163

(51) Int. Cl.[7] .............................. G02B 6/42; G02B 6/26
(52) U.S. Cl. .............................. 385/52; 385/24; 385/51
(58) Field of Search .................. 385/15, 24, 51–52

(56) References Cited

U.S. PATENT DOCUMENTS 6,269,209 B1 * 7/2001 Terada et al. ................. 385/51

FOREIGN PATENT DOCUMENTS

| EP | 0542444 A1 | 5/1993 |
| EP | 0723171 A2 | 7/1996 |
| GB | 2235546 A | 3/1991 |

OTHER PUBLICATIONS

Friedrich, Etienne E. L. et al, Journal of Lightwave Technology, vol. 10, No. 3, Mar. 1992.

Electronics Letters, Jun. 5, 1986, vol. 22, No. 12.

* cited by examiner

*Primary Examiner*—John D. Lee
*Assistant Examiner*—Jerry T Rahll
(74) *Attorney, Agent, or Firm*—Birch, Stewart, Kolasch & Birch, LLP

(57) ABSTRACT

A jig for the batch production of optical communication apparatuses includes a jig body whose upper surface is provided with a plurality of U-shaped recesses arranged in a matrix array to receive silicon bases each carrying optical devices and a plurality of vacuum holes vertically formed through the jig body, to communication with the respective bottom surfaces of the U-shaped recesses. The silicon bases received by the U-shaped recesses are held onto the bottom surfaces thereof when a vacuum is applied thereto through the vacuum holes. A method using the jig enables batch production by simultaneously processing many silicon bases.

12 Claims, 4 Drawing Sheets

JIG FOR THE BATCH PRODUCTION OF OPTICAL COMMUNICATION APPARATUSES, AND METHOD USING THE SAME

BACKGROUND OF THE INVENTION

1. Technical Field

The present invention relates to a jig for the batch production of optical communication apparatuses and to a batch production method using the jig. In particular, the present invention relates to a jig having a structure capable of holding a plurality of silicon bases thereon, so that the silicon bases can be processed in a batch fashion, thereby enabling mass production of optical communication apparatuses.

2. Description of the Prior Art

Generally, devices for optical communication are configured by coupling optical devices, such as laser diodes or photo diodes, to fiber optic transmission lines (hereinafter referred to as "optical fibers"). In the fabrication of such an optical communication apparatus, an optical device is coupled to an optical fiber, each of which is aligned with respect to the other to obtain optical transmission efficiency. The alignment of the optical device with the optical fiber is achieved using one of two basic methods. These are active alignment and passive alignment.

In the active alignment method, the coupling position is determined by peaking the amount of laserdiode light incident to a juxtaposed optical fiber. The laser diode and optical fiber are then fused at the determined coupling position by use of a laser welder or coupled by means of an epoxy adhesive. However, the determination of the exact coupling position requires a sophisticated technique.

Furthermore, the active alignment method involves high costs, corresponding to about 70~80% of the manufacturing costs of the final product. For this reason, it is imperative to reduce the manufacturing costs, which may be accomplished by reducing the number of elements used in the active alignment method or by improving the active alignment method itself.

In the passive alignment method, the coupling position between the laser diode and optical fiber is determined without activating the laser diode. The passive alignment method uses photolithography to fabricate a silicon base with a V-shaped micro-groove of a predetermined structure for coupling, and an optical fiber is arranged within the groove in a self-aligning manner. Also, passive alignment does not require the use of a laser welder, which is an expensive apparatus, so that optical communication apparatuses can be manufactured at a lower cost. Therefore, this method is more widely used than active alignment.

In a conventional passive alignment method, a V-shaped groove for an optical fiber, a U-shaped recess for a laser diode and a U-shaped recess for a monitor photo diode are all formed in the upper surface of one silicon base, into which these devices are respectively fitted. After completing the alignment of the optical devices and optical fiber on each silicon base of a given batch, the silicon bases are moved one by one to a die bonder in order to sequentially conduct a bonding process for the optical devices on the silicon bases. Subsequently, the silicon bases are moved one by one to a wire bonding stage to sequentially conduct a bonding process for metal wires of the silicon bases. The resultant silicon bases are then moved one by one to an epoxy bonder to sequentially conduct a capping process for the silicon bases.

Accordingly, each of the above processes are carried out for each silicon base, which is entirely counter to the advantages of batch production. The low process rate of such a conventional fabrication method for optical communication apparatuses results in a degradation in productivity because the fabrication is conducted by silicon base units, which greatly increases manufacturing costs.

SUMMARY OF THE INVENTION

Therefore, an object of the invention is to solve the above-described problems involved in the conventional method, by providing a jig and a method using the same for the batch production of optical communication apparatuses, to attain a high processing rate and improved productivity.

In accordance with one aspect of the present invention, there is provided a jig for the batch production of optical communication apparatuses comprising: a jig body whose upper surface is provided with a plurality of U-shaped recesses arranged so as to receive a plurality of silicon bases each carrying optical devices, and a plurality of vacuum holes vertically formed through the jig body such that the vacuum holes communicate with a bottom surface of each U-shaped recess.

In accordance with another aspect of the present invention, there is provided a batch production method for optical communication apparatuses comprising the steps of: seating a plurality of silicon bases, each carrying optical devices, on U-shaped recesses of a jig, the jig comprising a jig body whose upper surface is provided with a plurality of U-shaped recesses arranged so as to receive the plurality of silicon bases and a plurality of vacuum holes vertically formed through the jig body such that the vacuum holes communicate with a bottom surface of each U-shaped recess; and applying a vacuum to the vacuum holes of the jig body.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1:
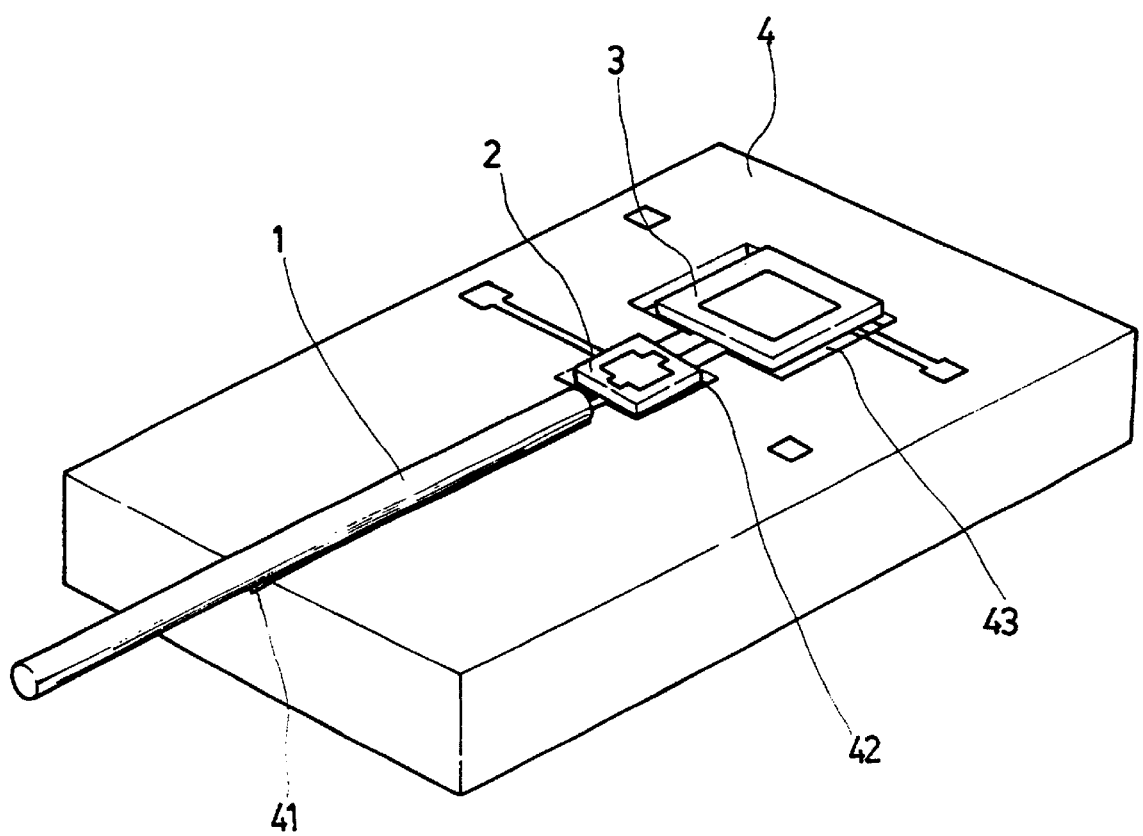
FIG. 1 is a perspective view schematically illustrating one of a plurality of silicon bases to be seated on a jig for the batch production of optical communication apparatuses in accordance with a preferred embodiment of t present invention.
Figure 2:
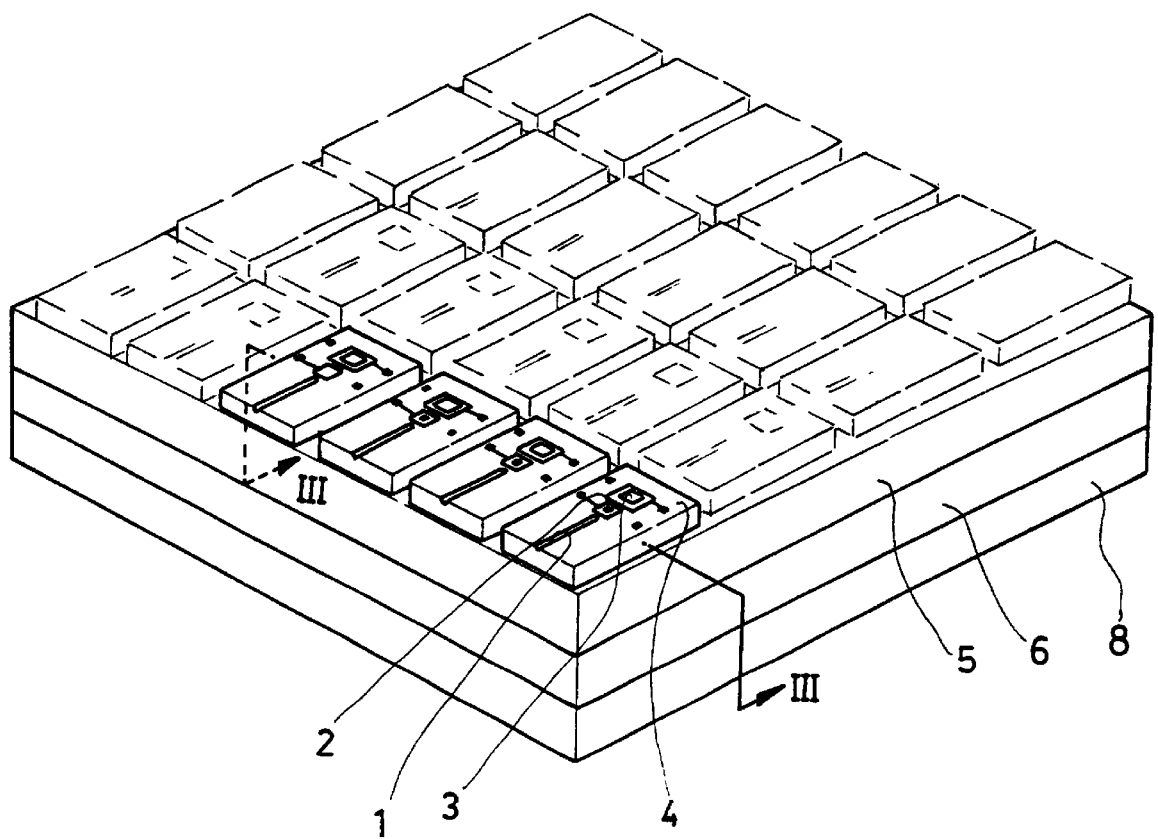
FIG. 2 a perspective view schematically illustrating the jig for the batch production of optical communication apparatuses in accordance with the embodiment of the present invention.
Figure 3:
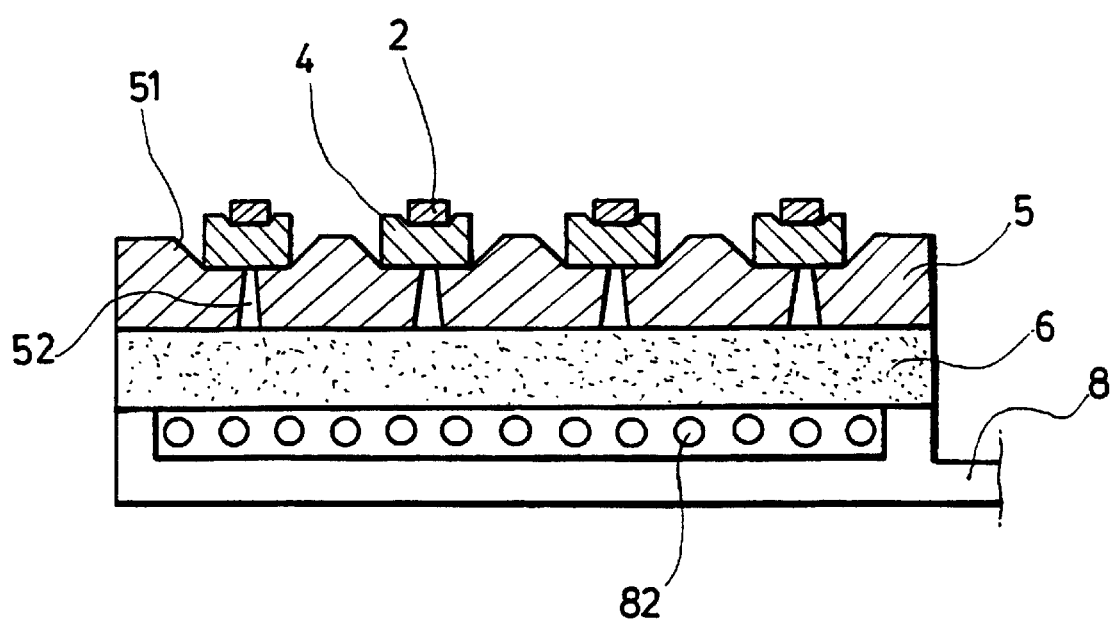
FIG. 3 is a cross-sectional view taken along line III—III of FIG. 2.

Referring to FIGS. 2 and 3, a jig for the batch production of optical communication apparatuses includes a rectangular jig body 5 whose upper surface is provided with a plurality of U-shaped recesses 51. The U-shaped recesses 51 are arranged in a matrix array and adapted to receive silicon bases 4, one of which is illustrated in FIG. 1. Each U-shaped recess 51 has a flat bottom and inclined side walls surrounding the flat bottom, so as to form a trapezoidal cross section. In order to hold the silicon bases 4 onto the respective bottom surfaces of the U-shaped recesses 51, a plurality of vacuum holes 52 are vertically formed through the jig body 5, to respectively communicate with the U-shaped recesses and thereby impart a vacuum effect on each silicon base.

The jig body 5 is preferably made of silicon. The jig body 5 may have a size of approximately 12.7 cm×12.7 cm, to hold about 1,000 silicon bases 4.

Preferably, the formation of the U-shaped recesses 51, which are formed at the upper surface of the jig body 5 to simultaneously receive a plurality of silicon bases 4, is achieved through photolithography and a chemical etching process using potassium hydroxide (KOH), with an accuracy (tolerance) of about 5 $\mu$m. Although one or more silicon bases 4 may be inaccurately received in its corresponding recess among the U-shaped recesses 51, the received silicon base or bases slide along the inclined surfaces of the U-shaped recess to their accurate seating positions. Thus, each silicon base 4 can be consistently and accurately seated on the bottom surface of the corresponding recess 51.

It is also preferred that the formation of the vacuum holes 52, which are vertically formed through the jig body 5, be achieved using a chemical etching process. When a vacuum is applied to the silicon bases 4 seated on the U-shaped recesses 51 via the vacuum holes 52, the silicon bases are firmly held on the jig body 5. Preferably, a porous plate 6 is attached to the lower surface of the jig body 5, to uniformly apply a vacuum to the jig body 5 through all of the vacuum holes 52 simultaneously, using a vacuum duct 8 provided under the porous plate. The porous plate 6 is preferably formed of sintered copper powder.

Selective holding and releasing of each silicon base 4 on the jig body 5 can be easily achieved by applying and removing a vacuum to the silicon base via the vacuum holes 52 and the vacuum duct 8. Accordingly, a vacuum applied to the jig may be removed when the jig is transported between successive processing stages, so that the vacuum is applied only when a given process is being conducted.

For instance, a pick-and-place process, by which a laser diode 2 and a monitor photo diode 3 are laid on the Dig, may be conducted while the silicon bases 4 are held firmly on the jig body 5 by virtue of an applied vacuum. Thus, during the pick-and-place process, the laser diode 2 and photo diode 3 are seated on the silicon base 4, along with an optical fiber 1. The silicon base 4 is formed with a V-shaped groove 41 for receiving an optical fiber, a U-shaped recess 42 for receiving a laser diode, and a U-shaped recess 43 for receiving a monitor photo diode, as shown in FIG. 1.

Using the jig according to the present invention, it is possible to simultaneously process a plurality of silicon bases 4 using an on-wafer fabrication process. That is, about 1,000 silicon bases 4 each having a size of 2 mm×4 mm can be subjected, in a batch fashion, to a series of successive processes, that is, a die bonding process, a wire bonding process, an epoxy bonding process, and a final testing process, while being firmly held on the jig body 5 by virtue of an applied vacuum. Accordingly, the present invention remarkably improves productivity, thereby enabling mass production, to achieve improvements in the efficiency of labor and equipment as well as processability. Thus, the manufacturing costs of optical communication apparatuses are greatly reduced.

To form the V-shaped groove 41 and U-shaped recesses 42 and 43 at each silicon base 4, patterns for each optical element (i.e., the optical fiber, the laser diode and the monitor photo diode) are formed on a silicon wafer by a masking method using a plasma-enhanced chemical vapor deposition process. The silicon wafer is then subjected to an etching process using a potassium hydroxide (KOH) etching solution. In the etching process, the grooves/recesses 41, 42 and 43 are formed by an anisotropic etching, such that their sides each have an angle of 54.7° with respect to the horizontal plane of the silicon wafer. For the laser diodes 2, a wafer is anisotropically etched by a chemical etching process for InP single crystals and is then cut into unit pieces. Each laser diode 2 and each silicon base 4 fabricated using the chemical etching process are measured using a non-contact three-dimensional measuring apparatus to determine the size and position of each etched portion. Based on the results of the measurement, each laser diode 2 and each silicon base 4 are processed using photolithography, to have a final accuracy of 1 $\mu$m or less.

The laser diodes 2 fabricated as described above can be easily and simply self-aligned on the silicon bases 4 held on the jig of the present invention. That is, by simply dropping each laser diode 2 onto its corresponding silicon base 4, within an approximately 10 $\mu$m window of tolerance, the diode slides along the inclined surfaces of the U-shaped recess 51 and is thereby automatically aligned on the silicon base 4. This automatic alignment method of the present invention greatly reduces processing time, as compared to the conventional alignment method involving flip-chip bonding or an infrared microscope to identify minutely etched patterns, due to the simultaneous processing for a large number of wafer chips.

Now, a batch production method for manufacturing optical communication apparatuses using the above-described jig will be described in accordance with an embodiment of the present invention.

In the batch production method of the present invention, a passive alignment method is used in which one optical fiber 1 is aligned with the V-shaped groove 41 of one silicon base 4 while one laser diode 2 is aligned with the U-shaped recess 42. Where a monitoring or light-receiving photo diode is to be aligned on the silicon base 4 in place of the laser diode 2, the same passive alignment method is applied. After completing the alignment for each silicon base 4 in accordance with the passive alignment method, an on-wafer fabrication process is conducted using the jig, which is configured in accordance with the present invention, that is, while having a size of 12.7 cm×12.7 cm to process about 1,000 silicon bases in a batch fashion. The fabrication of optical communication apparatuses is carried out by jig units, in contrast to the conventional method in which the fabrication is carried out by silicon base units. Thus, all silicon bases 4 held on the jig body 5 are simultaneously processed by a series of processes (e.g., die bonding, wire bonding and epoxy bonding). Therefore, the fabrication equipment can be integrated, thereby resulting in a great reduction in the costs for the initial investment in production equipment. That is, the entire fabrication process may be conducted by fixing in place the jig, on which the silicon bases 4 are firmly held, and sequentially applying thereto the operations of a die bonder, wire bonder, epoxy bonder, etc.

For the on-wafer fabrication process, in which about 1,000 or more optical communication apparatuses can be fabricated in a batch fashion using the jig of the present invention, it is important to fabricate constituting elements of the optical communication apparatus of the present invention, that is, laser diodes 2, monitor photo diodes 3, and silicon bases 4, so that each has a desired accuracy. As an example method of fabricating optical devices, e.g., the silicon bases 4, a silicon wafer is first selectively etched at predetermined regions, each corresponding to one silicon base, using a potassium hydroxide (KOH) etching solution, which are then measured using a three-dimensional measuring apparatus. Based on the results of the measurement, the etching process is conducted again for the etched silicon wafer in order to fabricate silicon bases 4 having a desired accuracy. Thereafter, the wafer is cut into pieces using, for example, a dicing saw, such that each piece corresponds to one silicon base 4 having a size of 2 mm×4 mm. For the fabrication of the laser diodes 2 and monitor photo diodes 3, a 1,300 nm-wavelength InP-strained multi-quantum well structure is used. The well structure is etched where desired patterns are to be formed and is then cut into pieces each corresponding to one laser diode 2 or monitor photo diode 3. The fabricated laser diodes are then measured in terms of outer size, using a non-contact three-dimensional measuring apparatus. Thereafter, a bonding metal, for example, Au—Sn (Sn at 20 wt %), is deposited to a thickness of 1 µm over each laser diode 2 and each monitor photo diode 3 by use of a metal depositing apparatus. Then, after the silicon bases 4, laser diodes 2 and monitor photo diodes 3 thus prepared are processed in a batch fashion using ultraviolet radiation and ozone gas, a conventional cleaning process (developed by RCA Corporation and commonly known as an RCA cleaning process) is conducted for the metal surfaces of the laser diodes 2 and monitor photo diodes 3. To check for the presence of organic substances, inorganic substances, and oxide films on each device, the devices are observed using an Auger electron spectroscope to determine whether impurities are present on the surface of each sample, before and after the RCA cleaning process. Based on the results of the checking, the applicability of the cleaning process conducted for each device is determined. After completing the cleaning process for all devices, the silicon bases 4 are laid on the jig body 5 using a pick-and-place process. Thereafter, laser diodes 2 and monitor photo diodes 3 are sequentially laid on the silicon bases 4, each type of device in a batch fashion, using the pick-and-place process.

Figure 4:
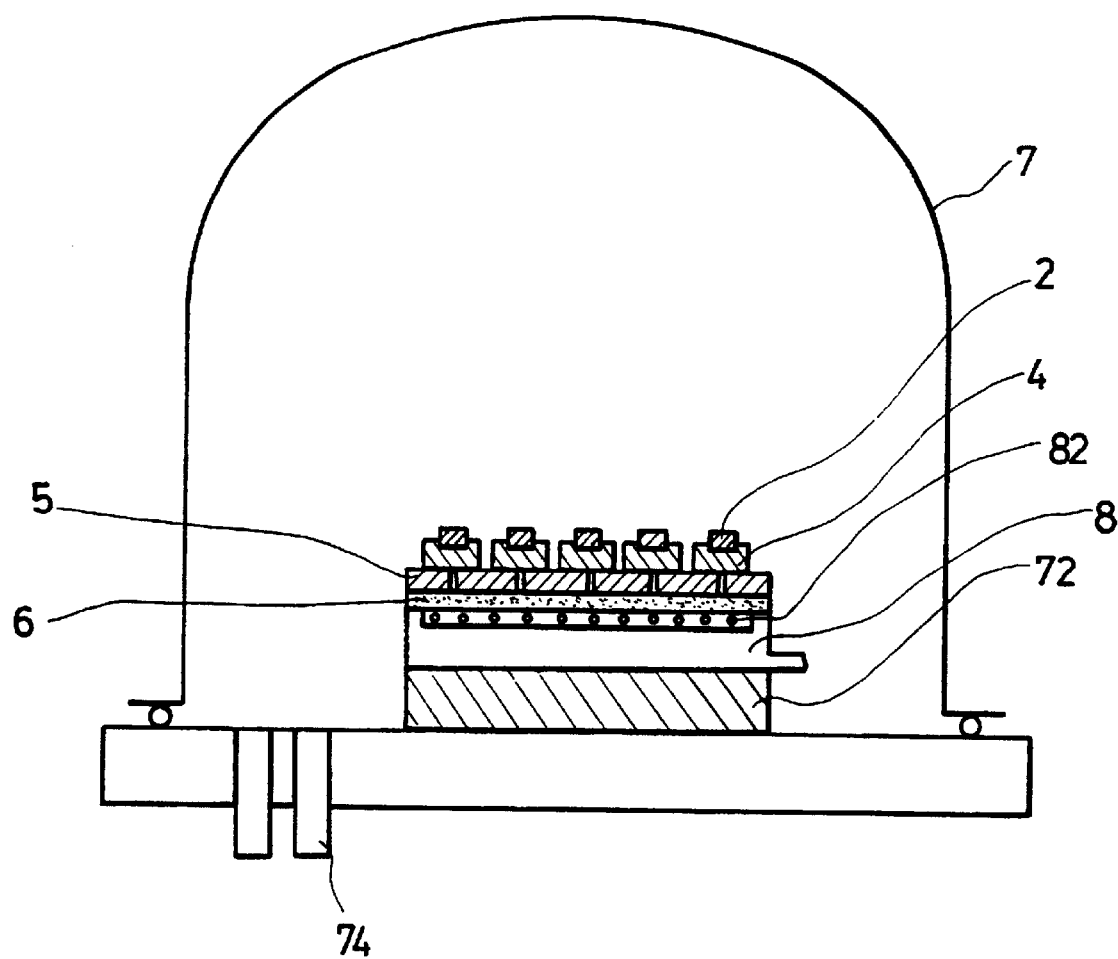
FIG. 4 is a cross-sectional view illustrating a die bonding process using the jig of the present invention.

Referring to FIG. 4, a die bonding process is illustrated which is conducted using the jig of the present invention. The jig, holding the silicon bases 4 on the jig body 5, is loaded in a vacuum chamber 7. In order to prevent metal solder used to bond with the silicon bases 4, from being oxidized in the vacuum chamber 7, a nitrogen atmosphere is introduced into the vacuum chamber through conduits 74. In a final state filled with nitrogen of high purity, the vacuum chamber 7 is heated to a temperature of about 310° C., which is above the melting point of most solders, and then cooled to room temperature, thereby allowing the laser diodes 2 and monitor photo diode 3 to be bonded to the respective silicon bases in a batch manner. In order to measure the bonding strength of each metal-bonded device, a test such as a micro-mechanical shear test is conducted to determine whether the tested device exhibits a standard shear stress of 0.15 Kgf/cm$^2$ or more, followed by an optoelectronic measurement for each device. Reference numeral 72 denotes a thermal insulating plate.

The jig is then processed for a wire bonding stage. The wire bonding process is performed on the jig, preferably by using a cold bonding method in which metal wires are bonded using ultrasonic energy. Here, it is necessary to firmly hold the silicon bases 4 to the jig body 5 in order to prevent the laser diodes 2 and monitor photo diodes 3 bonded on the silicon bases from moving due to mechanical vibrations resulting from the wire bonding process. Therefore, in the method of the present invention, air is vented from the vacuum holes 52 of the jig body 5, instead of a mechanical holding method which is conventionally used in such a process. As air is vented from the vacuum holes 52 of the jig body 5, a vacuum is applied to the jig body through the vacuum holes 52, thereby causing the silicon bases 4 laid in the recesses of the jig body, to be firmly held in place. At this time, the porous plate 6 is heated to a temperature of 100° C. by a resistive heater 82 beneath the porous plate.

After completing the wire bonding process, the jig is advanced to an epoxy bonding stage and a cap pick-and-place stage. A vacuum is uniformly applied to the jig body 5 in these processes, to firmly fix the silicon bases 4 to the jig body in the same manner as in the preceding process. Under this condition, a thermosetting epoxy resin is injected onto the silicon bases 4 through nozzles of an injector which can be finely controlled in terms of injection amount, so that the silicon bases 4 are coated with the epoxy resin. Thereafter, each epoxycoated silicon base 4 is capped with a cap made of a transparent material such as glass or silicon. As in the preceding process, these processes are conducted in a batch fashion on the jig body 5. Accordingly, there is a remarkable improvement in productivity, as compared to the conventional method conducted by silicon base units, enabling mass production.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

Industrial Applicability

As apparent from the above description, in accordance with the present invention, a jig is used which enables the batch production of optical communication apparatuses. By virtue of such a jig, a plurality of silicon bases can be simultaneously processed to fabricate optical communication apparatuses in a batch fashion. Accordingly, mass production of optical communication apparatuses is enabled by improvements in the efficiency of labor, equipment and processability, thereby greatly reducing manufacturing costs.

What is claimed is:

1. A jig for batch production of optical communication apparatuses, comprising:

a jig body whose upper surface is provided with a plurality of U-shaped recesses arranged so as to receive a plurality of silicon bases each carrying optical devices, a plurality of vacuum holes vertically formed through said jig body such that the vacuum holes communicate with a bottom surface of each U-shaped recess, and a porous plate attached to a lower surface of said jig body and adapted to uniformly apply a vacuum to the vacuum holes of the jig body.

2. The jig as claimed in claim 1, wherein said porous plate is fabricated by sintering copper powder.

3. The jig as claimed in claim 2, further comprising a resistive heater arranged beneath said porous plate.

4. The jig as claimed in claim 1, wherein the plurality of U-shaped recesses are arranged in a matrix array.

5. The jig as claimed in claim 1, wherein the optical devices are a laser diode and a photo diode.

6. The jig as claimed in claim 1, wherein the optical devices are a laser diode and a monitoring photo diode.

7. A batch production method for optical communication apparatuses, comprising the step of:

seating a plurality of silicon bases, each carrying optical devices, on U-shaped recesses of a jig, wherein the jig comprises:

a jig body whose upper surface is provided with a plurality of U-shaped recesses arranged so as to receive the plurality of silicon bases and a plurality of vacuum holes vertically formed through the jig body such that the vacuum holes communicate with a bottom surface of each U-shaped recess, and a porous plate attached to a lower surface of said jig body and adapted to uniformly apply a vacuum to the vacuum holes of the jig body.

8. The method as claimed in claim 7, further comprising the step of applying a vacuum to the vacuum holes of the jig.

9. The method as claimed in claim 8, further comprising the step of applying ultrasonic energy to metal wires respectively arranged adjacent the optical devices carried by the silicon bases, to bond the metal wires to the optical devices.

10. The method as claimed in claim 9, further comprising the steps of:

injecting a thermosetting epoxy resin onto the silicon bases, to coat the silicon bases with the thermosetting epoxy resin; and capping the coated silicon bases with caps made of a transparent material.

11. The method as claimed in claim 7, further comprising the steps of:

loading the jig, on which the silicon bases are laid, in a vacuum chamber filled with nitrogen gas; and heating the vacuum chamber to a temperature not less that the melting point of a solder used to bond the optical devices carried by the silicon bases to the silicon bases, and then cooling the vacuum chamber to bond the optical devices to the silicon bases.

12. A batch production method for optical communication apparatuses, comprising the steps of:

preparing a silicon jig whose upper surface is provided with a plurality of U-shaped recesses, arranged and respectively adapted to receive silicon bases in a self-aligning fashion, through a photolithography process and an anisotropic chemical etching process, the silicon jig having a plurality of vacuum holes adapted to hold the received silicon bases onto respective bottom surfaces of the U-shaped recesses by virtue of a vacuum applied to the vacuum holes of the silicon jig;

laying a plurality of silicon bases on the silicon jig;

applying a vacuum to the silicon jig and then laying optical devices on the silicon bases;

releasing the vacuum applied to the silicon jig and then moving the silicon jig;

repeating said applying and releasing steps as necessary for sequentially conducting a series of processes for manufacturing optical communication apparatuses;

injecting a thermosetting epoxy resin onto the respective silicon bases, while maintaining the vacuum applied to the silicon jig, to coat the silicon bases with the thermosetting epoxy resin; and capping the coated silicon bases with caps made of a transparent material.

* * * * *